United States Patent
Wu

(10) Patent No.: US 11,081,661 B2
(45) Date of Patent: Aug. 3, 2021

(54) FLEXIBLE ORGANIC LIGHT-EMITTING DIODE PANEL

(71) Applicant: Wuhan China Star Optoelectronics Semiconductor Display Technology Co., Ltd., Wuhan (CN)

(72) Inventor: Kerong Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 30 days.

(21) Appl. No.: 16/467,982

(22) PCT Filed: Feb. 14, 2019

(86) PCT No.: PCT/CN2019/075007
§ 371 (c)(1),
(2) Date: Jun. 10, 2019

(87) PCT Pub. No.: WO2020/113820
PCT Pub. Date: Jun. 11, 2020

(65) Prior Publication Data
US 2020/0194697 A1 Jun. 18, 2020

(30) Foreign Application Priority Data
Dec. 3, 2018 (CN) .......................... 201811468303.0

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3246* (2013.01); *H01L 27/3283* (2013.01); *H01L 51/5253* (2013.01); *H01L 2251/5338* (2013.01)

(58) Field of Classification Search
CPC ......... H01L 2251/5338; H01L 27/3246; H01L 2924/12044; H01L 27/32; H01L 51/0097; H01L 27/3283; H01L 51/5253; H01L 27/3258; H01L 51/52; Y02E 10/549
USPC ............................................................. 257/40
See application file for complete search history.

(56) References Cited

U.S. PATENT DOCUMENTS

| | | | |
|---|---|---|---|
| 2017/0110532 A1* | 4/2017 | Kim | H01L 51/0096 |
| 2017/0117502 A1* | 4/2017 | Park | H01L 51/56 |
| 2017/0154935 A1* | 6/2017 | Cai | H01L 51/5209 |
| 2017/0237038 A1* | 8/2017 | Kim | H01L 51/5253 257/40 |
| 2017/0287995 A1* | 10/2017 | Kim | H01L 27/3258 |

* cited by examiner

Primary Examiner — Jonathan Han

(57) ABSTRACT

The present invention provides a flexible organic light-emitting diode (OLED) panel, including: a flexible substrate which includes a channel; a buffer layer disposed on the second organic layer, the buffer layer including a buffer layer groove; a first block wall disposed on the buffer layer, the first block wall surrounding the buffer layer groove and defining a display region; a second block wall disposed on the buffer layer and over the channel, the second block wall surrounding the first block wall; and a packaging layer disposed in the display region, the packaging layer including an organic packaging layer, a portion of the organic packaging layer being disposed in the buffer layer groove and in contact with the flexible substrate.

17 Claims, 4 Drawing Sheets

FLEXIBLE ORGANIC LIGHT-EMITTING DIODE PANEL

RELATED APPLICATIONS

This application is a National Phase of PCT Patent Application No. PCT/CN2019/075007 having International filing date of Feb. 14, 2019, which claims the benefit of priority of Chinese Patent Application No. 201811468303.0 filed on Dec. 3, 2018. The contents of the above applications are all incorporated by reference as if fully set forth herein in their entirety.

FIELD AND BACKGROUND OF THE INVENTION

The present invention relates to a field of display devices and in particular, to a flexible organic light-emitting diode (OLED) panel.

The biggest advantage of a flexible organic light-emitting diode (OLED) panel is that it can be made into a foldable/bendable product. Compared with a rigid OLED panel packaged with glass (which cannot be bent), the flexible OLED panel adopts thin film encapsulation (TFE) technology. As shown in FIG. 1A and FIG. 1B, a current common TFE film structure 150 consists of an inorganic layer 151, an organic layer 152, and an inorganic layer 153 stacked on each other in sequence. The inorganic layers are used to block moisture/oxygen, and the organic layer is used to achieve planarization and release the stress of the inorganic layer. However, compared to the rigid OLED panels packaged with glass, the TFE package structure's ability to block moisture/oxygen needs to be further improved.

In the above-mentioned current flexible OLED panel, two block walls 121 and 122 are disposed near a cutting line, i.e., near an edge of the flexible OLED panel, to prevent the organic layer 152 of the TFE structure from overflowing. However, since the inorganic layers 151, 153, and the organic layer 152 are only in planar contact, the organic layer 152 and the inorganic layers 151 and 153 of the TFE structure are peeled off due to the stress of the bending. Peeling occurs particularly at a boundary in contact with the block walls 121 and 122, so moisture/oxygen is allowed to permeate into the flexible OLED panel through a peeling portion, thereby causing display failure/poor display.

Therefore, it is necessary to provide a flexible OLED panel to solve the problems of the conventional techniques.

SUMMARY OF THE INVENTION

It is an object of the present invention to provide a flexible organic light-emitting diode (OLED) panel that allows an organic layer in a TFE package structure to be in contact with a flexible substrate, thereby increasing the adhesion of the organic layer and avoiding the problem of peeling. Another object of the present invention is to provide a flexible OLED panel that can further improve an ability of blocking moisture/oxygen and improve the quality of packaging of the flexible OLED panel.

Accordingly, the present invention provides a flexible OLED panel, comprising:
   a flexible substrate, the flexible substrate comprising:
      a first organic layer;
         an inorganic layer disposed on the first organic layer;
         and a second organic layer disposed on the inorganic layer, the second organic layer comprising a plurality of channels;
   a buffer layer disposed on the second organic layer and inside the channels, the buffer layer comprising a buffer layer groove, the buffer layer groove exposing the second organic layer;
   a first block wall disposed on the buffer layer, the first block wall surrounding the buffer layer groove and defining a display region;
   a second block wall disposed on the buffer layer and over the channels, the second block wall surrounding the first block wall; and
   a packaging layer disposed in the display region, the packaging layer comprising a first inorganic packaging layer, an organic packaging layer, and a second inorganic packaging layer, a portion of the organic packaging layer being disposed in the buffer layer groove and in contact with the second organic layer.

According to one embodiment of the present invention, the organic packaging layer is disposed between the first inorganic packaging layer and the second inorganic packaging layer.

According to one embodiment of the present invention, material of the second organic layer comprises polyimide.

According to one embodiment of the present invention, the first block wall and the second block wall are made of an organic material.

According to one embodiment of the present invention, the buffer layer is in contact with the inorganic layer.

According to one embodiment of the present invention, the first inorganic packaging layer is disposed on the buffer layer, and the second inorganic packaging layer is disposed on the organic packaging layer.

According to one embodiment of the present invention, the second inorganic packaging layer covers the first block wall and the second block wall.

The present invention provides a flexible OLED panel, comprising:
   a flexible substrate, the flexible substrate comprising a channel;
   a buffer layer disposed on the flexible substrate, the buffer layer comprising a buffer layer groove;
   a first block wall disposed on the buffer layer, the first block wall surrounding the buffer layer groove and defining a display region;
   a second block wall disposed on the buffer layer and over the channel, the second block wall surrounding the first block wall; and
   a packaging layer disposed in the display region, the packaging layer comprising an organic packaging layer, a portion of the organic packaging layer being disposed in the buffer layer groove and in contact with the flexible substrate.

According to one embodiment of the present invention, the flexible OLED panel further comprises a planarization layer and a pixel defining layer. The planarization layer and the pixel defining layer are disposed in the display region, wherein the planarization layer is disposed on the buffer layer, and the pixel defining layer is disposed on the planarization layer.

According to one embodiment of the present invention, the packaging layer further comprises a first inorganic packaging layer and a second inorganic packaging layer, and the organic packaging layer is disposed between the first inorganic packaging layer and the second inorganic packaging layer.

According to one embodiment of the present invention, the flexible substrate comprises a polyimide layer, and the polyimide layer is in contact with the organic packaging layer.

According to one embodiment of the present invention, the first block wall and the second block wall are made of an organic material.

The present invention provides a flexible OLED panel, comprising:
a flexible substrate, the flexible substrate comprising:
a first organic layer;
an inorganic layer disposed on the first organic layer; and
a second organic layer disposed on the inorganic layer, the second organic layer comprising a channel;
a buffer layer disposed on the flexible substrate, a portion of the buffer layer being disposed in the channel and in contact with the inorganic layer, the buffer layer comprising a buffer layer groove;
a first block wall disposed on the buffer layer, the first block wall surrounding the buffer layer groove and defining a display region; and
a packaging layer disposed in the display region, the packaging layer comprising an organic packaging layer, a portion of the organic packaging layer being disposed in the buffer layer groove and in contact with the flexible substrate.

According to one embodiment of the present invention, material of the second organic layer comprises polyimide.

According to one embodiment of the present invention, the flexible OLED panel further comprises a second block wall, the second block wall is disposed on the buffer layer and over the channel, and the second block wall surrounds the first block wall.

According to one embodiment of the present invention, the first block wall and the second block wall are made of an organic material.

According to one embodiment of the present invention, the flexible OLED panel further comprises a planarization layer and a pixel defining layer. The planarization layer and the pixel defining layer are disposed in the display region, wherein the planarization layer is disposed on the buffer layer, and the pixel defining layer is disposed on the planarization layer.

The invention has the beneficial effects that the organic packaging layer is in contact with the flexible substrate through the buffer layer groove, thereby increasing a contact area of the organic packaging layer, thereby improving the adhesion of the organic packaging layer and avoiding the problem of peeling. In addition, the buffer layer is brought into contact with the inorganic layer in the flexible substrate through the channel of the second organic layer, thereby further improving the ability of blocking moisture/oxygen and improving the quality of packaging of the flexible OLED panel.

BRIEF DESCRIPTION OF THE SEVERAL
VIEWS OF THE DRAWINGS

In order to make the above-mentioned contents of the present invention more comprehensible, the preset invention is further described with reference to the accompanying drawings and embodiments:

DESCRIPTION OF SPECIFIC EMBODIMENTS
OF THE INVENTION

The following embodiments are described with reference to the accompanying drawings, and are used to exemplify particular embodiments that the present invention can be used to implement. Direction terms mentioned in the present invention such as "upper", "lower", "front", "rear", "left", "right", "top", and "bottom" are only directions with reference to the accompanying drawings. Therefore, the used direction terms are intended to describe and understand the present invention, but are not intended to limit the present invention.

Figure 1A:
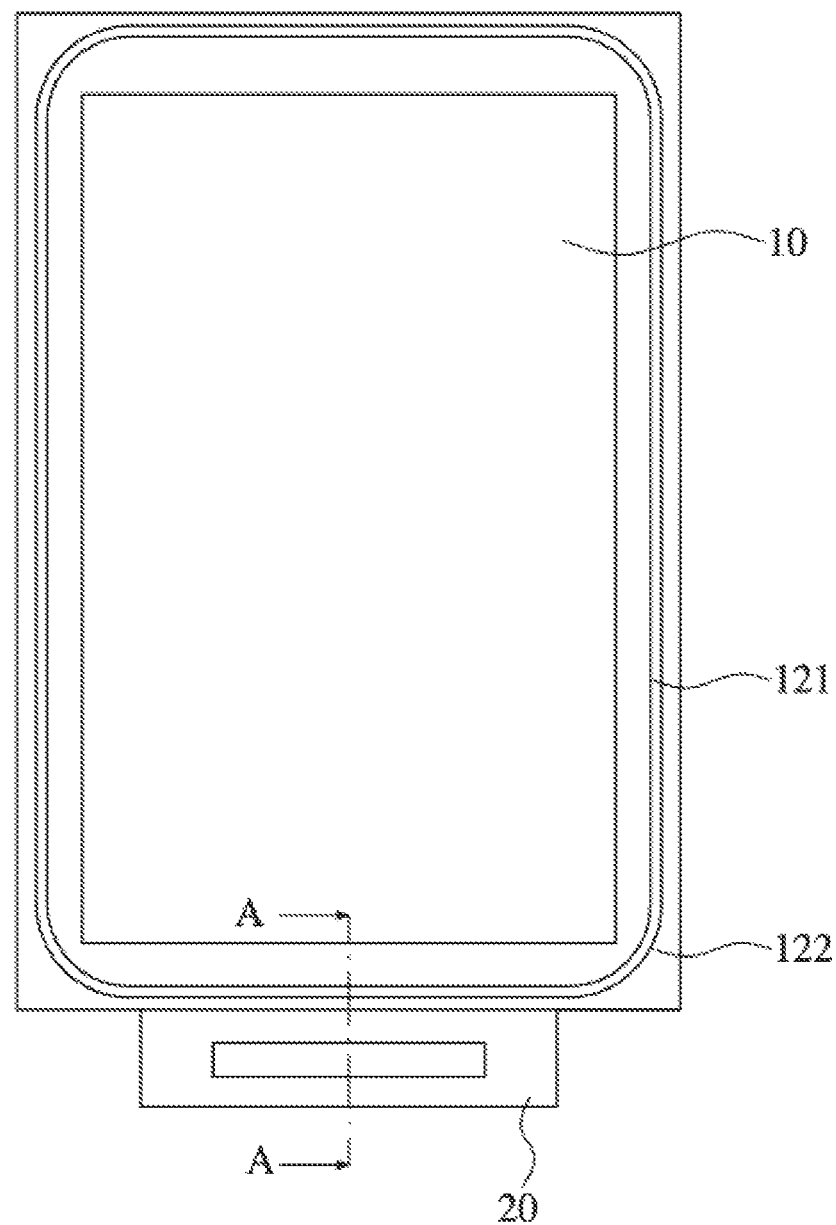
FIG. 1A is a top view of a conventional flexible organic light-emitting diode (OLED) display.

Please refer to FIG. 1A, which is a top view of a conventional flexible organic light-emitting diode (OLED) panel. The conventional flexible OLED panel comprises a display region 10, a bending region 20, a first block wall, and a second block wall 122. The first block wall 121 surrounds the display region 10, the second block wall 122 surrounds the first block wall 121. The first block wall 121 is disposed adjacent to a periphery of the flexible OLED panel and adjacent to the bending region 20. The second block wall 122 is disposed between the periphery of the flexible OLED panel/the bending region 20 and the first block wall 121.

Figure 1B:
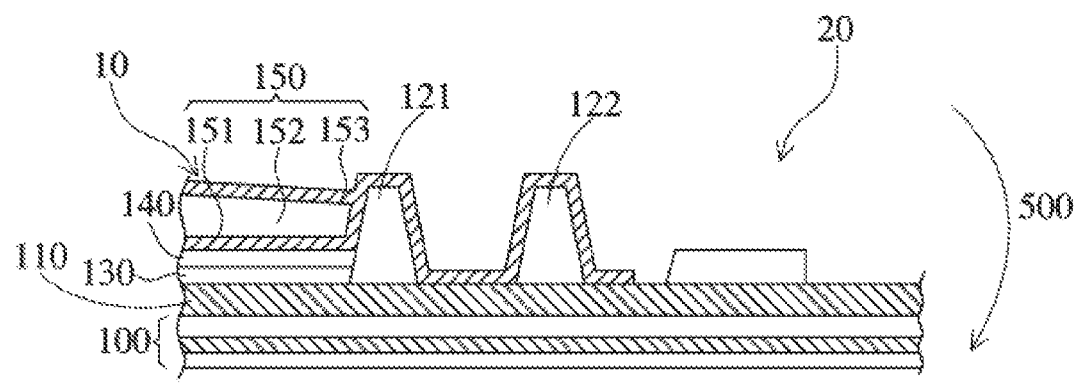
FIG. 1B is a cross-sectional view taken along a line A-A of FIG. 1A.

Please refer to FIG. 1B, which is a cross-sectional view taken along a line A-A. The conventional flexible OLED panel comprises a flexible substrate 100, a buffer layer 110, a planarization layer 130, a pixel defining layer 140, and a packaging layer 150. The packaging layer 150 comprises a first inorganic packaging layer 151, an organic packaging layer 152, and a second inorganic packaging layer 153. Modified by the planarization layer 130, film undulation above the planarization layer 130 is not too large in the display region 10. The first inorganic packaging layer 151, the organic packaging layer 152, and the second inorganic packaging layer 153 are in planar contact between layers, and even exaggeratedly, they have only one surface in contact. Therefore, when the bending region 20 of the flexible OLED panel is stressed (as indicated by an arrow 500), a contact surface between the first inorganic packaging layer 151, the organic packaging layer 152, and the second inorganic packaging layer 153 may cause peeling (not illustrated), so that moisture/oxygen permeates into the flexible OLED panel through the peeling portion, thus causing poor display.

Figure 2:
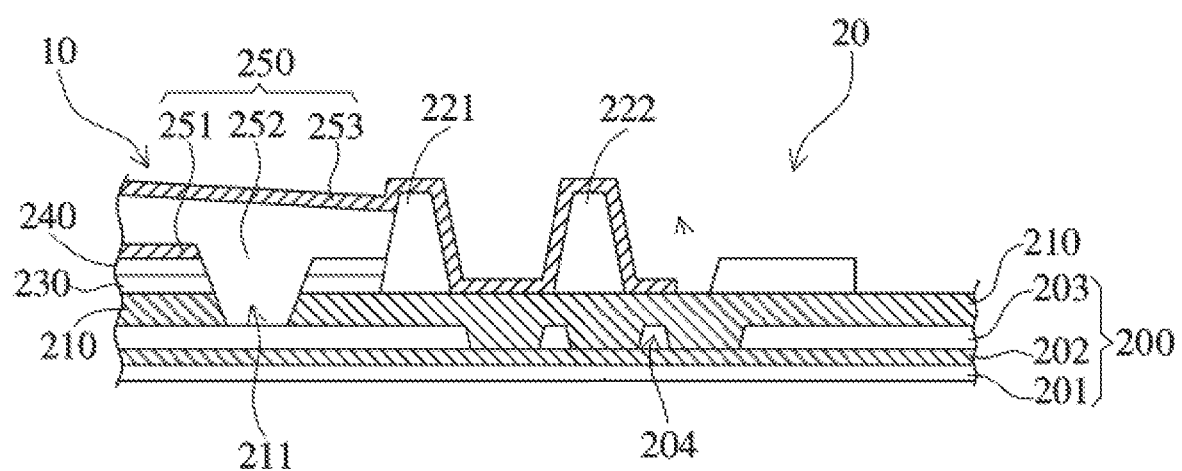
FIG. 2 is a partial cross-sectional view illustrating a flexible OLED panel according to one embodiment of the present invention.

Please refer to FIG. 2, which is a partial cross-sectional view of a flexible OLED panel according to one embodiment of the present invention. The partial cross-sectional view is taken at a position similar to the line A-A of FIG. 1A. The present embodiment provides a flexible OLED panel. The flexible OLED panel comprises: a flexible substrate 200, a buffer layer 210, a first block wall 221, a second block wall 222, a planarization layer 230, a pixel defining layer 240, and a packaging layer 250.

The flexible substrate 200 comprises a first organic layer 201, an inorganic layer 202, and a second organic layer 203. The inorganic layer 202 is disposed on the first organic layer 201. The second organic layer 203 is disposed on the inorganic layer 202. The second organic layer 203 comprises a plurality of channels 204. Material of the second organic layer 203 comprises polyimide. The channels 204 can be formed by exposure development or other similar techniques. The first organic layer 201 may be made of material the same as the material of the second organic layer 203.

The buffer layer 210 is disposed on the flexible substrate 200 and in particular, on the second organic layer 203. Moreover, a portion of the buffer layer 210 is disposed inside the channels 204 and in contact with the inorganic layer 202. The buffer layer 210 comprises a buffer layer groove 211. The buffer layer groove 211 exposes the second organic layer 203 of the flexible substrate 200. The buffer layer 210 may be made of an inorganic material, such as silicon nitride (SiNx), silicon oxide (SiOx), or other single-layer films or multi-layered films having the function of blocking moisture/oxygen.

The first block wall 221 is disposed on the buffer layer 210. The first block wall 221 surrounds the buffer layer groove 211 and defines a display region 10. The second block wall 222 is disposed on the buffer layer 210 and over the channels 204. The second block wall 222 surrounds the first block wall 221. Similar to the top view of the conventional OLED panel in FIG. 1A, the second block wall 222 is disposed between a periphery of the flexible OLED panel and the first block wall 221, or between a bending region 20 of the flexible OLED panel and the first block wall 221. The first block wall 221 and the second block wall 222 can be made of an organic material, such as hexamethyldisiloxane, polyimide, or other suitable organic materials.

The planarization layer 230 and the pixel defining layer 240 are disposed in the display region 10. The planarization layer 230 is disposed on the buffer layer 210. The pixel defining layer 240 is disposed on the planarization layer 230. The planarization layer 230 and the pixel defining layer 240 may be made of an organic material.

The packaging layer 250 is disposed in the display region 10. The packaging layer 250 comprises a first inorganic packaging layer 251, an organic packaging layer 252, and a second inorganic packaging layer 253. The organic packaging layer 252 is disposed between the first inorganic packaging layer 251 and the second inorganic packaging layer 253. A portion of the organic packaging layer 252 is disposed in the buffer layer groove 211 and in contact with the second organic layer 203 of the flexible substrate 200. Furthermore, the organic packaging layer 252 is in contact with an inner wall surface of the first block wall 221. The first inorganic packaging layer 251 is disposed on the pixel defining layer 240. The second inorganic packaging layer 253 is disposed on the organic packaging layer 252. In addition, the second inorganic packaging layer 253 also covers the first block wall 221 and the second block wall 222.

The first inorganic packaging layer 251 and the second inorganic packaging layer 253 may be formed by plasma-enhanced chemical vapor deposition (PECVD), atomic layer deposition (ALD), pulsed laser deposition (PLD), sputtering, evaporation, or other technologies. The first inorganic packaging layer 251 and the second inorganic packaging layer 253 may consist of one of aluminum oxide (Al2O3), zinc peroxide (ZnO2), titanium dioxide (TiO2), silicon nitride (SiNx), silicon carbonitride (SiCNx), silicon oxide (SiOx), zirconium dioxide (ZrO2), and aluminum nitride (AlN), or a combination thereof. The first inorganic packaging layer 251 and the second inorganic packaging layer 253 function to block moisture/oxygen.

The organic packaging layer 252 can be formed by spin coating, screen printing, slit spin coating, dispensing, ink jet printing (IJP) or the like. The organic packaging layer 252 consists of one or more of acrylate, hexamethyldisiloxane, polyacrylate, polycarbonate, and polystyrene.

In the embodiment of FIG. 2, the organic packaging layer 252 contacts the second organic layer 203 of the flexible substrate 200 through the buffer layer groove 211. Therefore, a contact area of the organic packaging layer 252 increases, and the adhesion of the organic packaging layer 252 also increases by contacting the second organic layer 203, thus greatly reducing the risk of peeling. The buffer layer 210 contacts the inorganic layer 202 through the channel 204, which makes it difficult for moisture/oxygen to permeate from the side of the flexible substrate 200, thereby improving the ability of the flexible OLED panel to block moisture/oxygen. In addition to that, such a design also improves the adhesion of the buffer layer 210.

Figure 3:
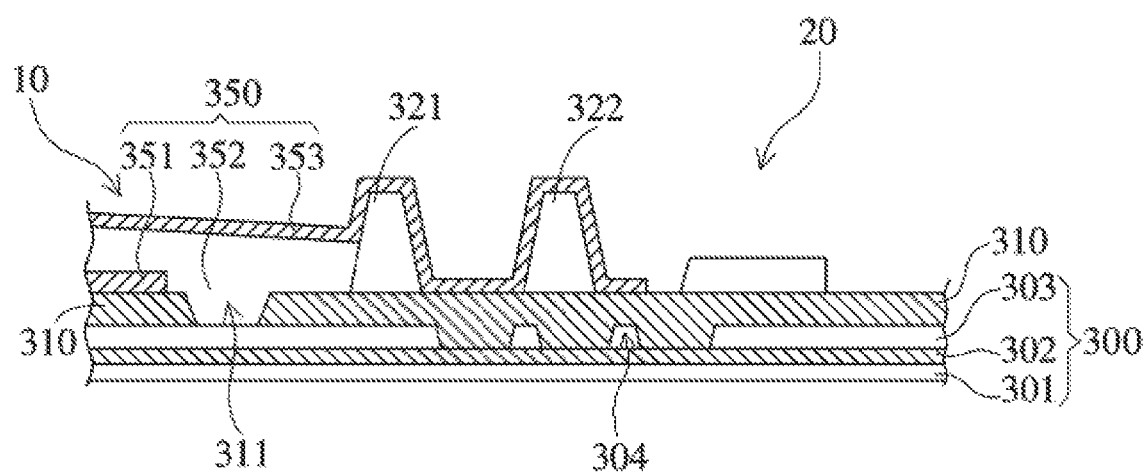
FIG. 3 is a partial cross-sectional view illustrating a flexible OLED panel according to another embodiment of the present invention.

Please refer to FIG. 3, which is a partial cross-sectional view illustrating a flexible OLED panel according to another embodiment of the present invention. This partial cross-sectional view is taken at a position similar to the line A-A of FIG. 1A. The present embodiment provides a flexible OLED panel. The flexible OLED panel comprises: a flexible substrate 300, a buffer layer 310, a first block wall 321, a second block wall 322, and a packaging layer 350.

The flexible substrate 300 comprises a first organic layer 301, an inorganic layer 302, and a second organic layer 303. The inorganic layer 302 is disposed on the first organic layer 301. The second organic layer 303 is disposed on the inorganic layer 302. The second organic layer 303 comprises a plurality of channels 304. Material of the second organic layer 303 comprises polyimide. The channels 304 can be formed by exposure development or other similar techniques. The first organic layer 301 may be made of material the same as the material of the second organic layer 303.

The buffer layer 310 is disposed on the flexible substrate 300 and in particular, on the second organic layer 303. Moreover, a portion of the buffer layer 310 is disposed inside the channels 304 and in contact with the inorganic layer 302. The buffer layer 300 comprises a buffer layer groove 311. The buffer layer groove 311 exposes the second organic layer 303 of the flexible substrate 300. The buffer layer 310 may be made of an inorganic material, such as silicon nitride (SiNx), silicon oxide (SiOx), or other single-layer films or multi-layered films having the function of blocking moisture/oxygen.

The first block wall 321 is disposed on the buffer layer 310. The first block wall 321 surrounds the buffer layer groove 311 and defines a display region 10. The second block wall 322 is disposed on the buffer layer 310 and over the channels 304. The second block wall 322 surrounds the first block wall 321. Similar to the top view of the conventional OLED panel in FIG. 1A, the second block wall 322 is disposed between a periphery of the flexible OLED panel and the first block wall 321, or between a bending region 20 of the flexible OLED panel and the first block wall 321. The first block wall 321 and the second block wall 322 can be made of an organic material, such as hexamethyldisiloxane, polyimide, or other suitable organic materials.

The packaging layer 350 is disposed in the display region 10, the packaging layer 350 comprises a first inorganic packaging layer 351, an organic packaging layer 352, and a second inorganic packaging layer 353. The organic packaging layer 352 is disposed between the first inorganic packaging layer 351 and the second inorganic packaging layer 353. A portion of the organic packaging layer 352 is disposed in the buffer layer groove 311 and in contact with the second organic layer 303 of the flexible substrate 300. Furthermore, the organic packaging layer 352 is in contact with an inner wall surface of the first block wall 321. The first inorganic packaging layer 351 is disposed on the buffer layer 310. The second inorganic packaging layer 353 is disposed on the organic packaging layer 352. In addition, the second inorganic packaging layer 353 also covers the first block wall 321 and the second block wall 322.

The first inorganic packaging layer 351 and the second inorganic packaging layer 353 may be formed by plasma-enhanced chemical vapor deposition (PECVD), atomic layer deposition (ALD), pulsed laser deposition (PLD), sputtering, evaporation, or other technologies. The first inorganic packaging layer 351 and the second inorganic packaging layer 353 may consist of one of aluminum oxide (Al2O3), zinc peroxide (ZnO2), titanium dioxide (TiO2), silicon nitride (SiNx), silicon carbonitride (SiCNx), silicon oxide (SiOx), zirconium dioxide (ZrO2), and aluminum nitride (AlN), or a combination thereof. The first inorganic packaging layer 351 and the second inorganic packaging layer 353 function to block moisture/oxygen.

The organic packaging layer 352 can be formed by spin coating, screen printing, slit spin coating, dispensing, ink jet printing (IJP), or the like. The organic packaging layer 352 consists of one or more of acrylate, hexamethyldisiloxane, polyacrylate, polycarbonate, and polystyrene.

Compared with the embodiment of FIG. 2, in the embodiment of FIG. 3, in the display area 10 and adjacent to the first block wall 321, there are no planarization layer and pixel defining layer, and the first inorganic packaging layer 351 directly contacts the buffer layer 310, thus further increasing the adhesion of the first inorganic packaging layer 351 and the ability to block moisture/oxygen.

Figure 4:
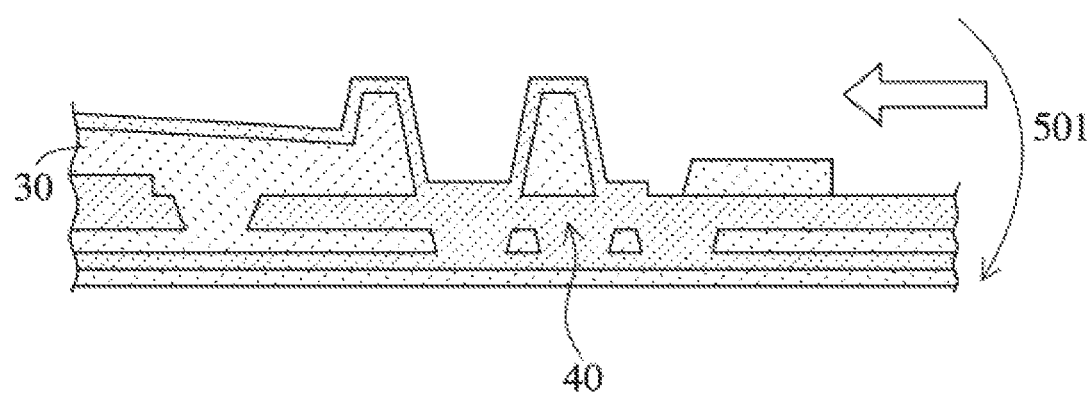
FIG. 4 is a schematic view illustrating different material of films and layers.

Please refer to FIGS. 3 and 4. FIG. 4 is a schematic view illustrating different materials of films and layers of FIG. 3. In this embodiment, the multi-layered organic materials (such as the second organic layer 303, the first block wall 321, and the organic packaging layer 352) in the display region are connected to form an organic structure 30, thereby increasing adhesion of each organic film layer. The multi-layered inorganic materials (such as the inorganic layer 302 and the buffer layer 310) outside the display region (i.e., near the second block wall 322) are connected to form an inorganic structure 40, thereby improving the ability of the flexible OLED panel to block moisture/oxygen. This way, when the flexible OLED panel is stressed (as indicated by the arrow 501), the risk of peeling is greatly reduced between each film layer (e.g. between the organic layers, between the inorganic layers, or between the organic layer and the inorganic layer). Furthermore, it is also difficult for moisture/oxygen to permeate into the display region 10 due to the inorganic structure 40. Similarly, the embodiment in FIG. 2 also has a similar structure and effect.

The invention has the following advantages: The organic packaging layer 252, 352 contacts with the second organic layer 203, 303 of the flexible substrate 200, 300 through the buffer layer groove 211, 311, thereby increasing a contact area of the organic packaging layer 252, 352, thus improving the adhesion of the organic packaging layer 252, 352 and avoiding the problem of peeling. In addition, the buffer layer 210, 310 is brought into contact with the inorganic layer 202, 302 in the flexible substrate 200, 300 through the channel 204, 304 of the second organic layer 203, 303, thereby further improving the ability to block moisture/oxygen and improving the quality of encapsulation of the flexible OLED panel.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A flexible organic light-emitting diode (OLED) panel, comprising:
    a flexible substrate, the flexible substrate comprising:
        a first organic layer;
        an inorganic layer disposed on the first organic layer; and
        a second organic layer disposed on the inorganic layer, the second organic layer comprising a plurality of channels;
    a buffer layer disposed on the second organic layer and inside the channels, the buffer layer comprising a buffer layer groove;
    a first block wall disposed on the buffer layer, the first block wall surrounding the buffer layer groove and defining a display region;
    a second block wall disposed on the buffer layer and over the channels, a portion of the buffer layer disposed in each of the channels and contacting with the inorganic layer, and the second block wall surrounding the first block wall; and
    a packaging layer disposed in the display region, the packaging layer comprising a first inorganic packaging layer, an organic packaging layer, and a second inorganic packaging layer, a portion of the organic packaging layer disposed in the buffer layer groove and contacting with the second organic layer of the flexible substrate.

2. The flexible OLED panel according to claim 1, wherein the organic packaging layer is disposed between the first inorganic packaging layer and the second inorganic packaging layer.

3. The flexible OLED panel according to claim 1, wherein material of the second organic layer comprises polyimide.

4. The flexible OLED panel according to claim 3, wherein the first block wall and the second block wall are made of an organic material.

5. The flexible OLED panel according to claim 1, wherein the buffer layer is in contacts with the inorganic layer.

6. The flexible OLED panel according to claim 1, wherein the first inorganic packaging layer is disposed on the buffer layer, and the second inorganic packaging layer is disposed on the organic packaging layer.

7. The flexible OLED panel according to claim 6, wherein the second inorganic packaging layer covers the first block wall and the second block wall.

8. A flexible OLED panel, comprising:
    a flexible substrate comprising a channel;
    a buffer layer disposed on the flexible substrate, the buffer layer comprising a buffer layer groove;
    a first block wall disposed on the buffer layer, the first block wall surrounding the buffer layer groove and defining a display region;
    a second block wall disposed on the buffer layer and over the channel, a portion of the buffer layer disposed in the channel and contacting with the inorganic layer, and the second block wall surrounding the first block wall; and
    a packaging layer disposed in the display region, the packaging layer comprising an organic packaging layer, a portion of the organic packaging layer disposed in the buffer layer groove and contacting with the flexible substrate.

9. The flexible OLED panel according to claim 8, further comprising a planarization layer and a pixel defining layer, the planarization layer and the pixel defining layer being disposed in the display region, wherein the planarization layer is disposed on the buffer layer, and the pixel defining layer is disposed on the planarization layer.

10. The flexible OLED panel according to claim 8, wherein the packaging layer further comprises a first inorganic packaging layer and a second inorganic packaging layer, and the organic packaging layer is disposed between the first inorganic packaging layer and the second inorganic packaging layer.

11. The flexible OLED panel according to claim 8, wherein the flexible substrate comprises a polyimide layer, and the polyimide layer is in contacts with the organic packaging layer.

12. The flexible OLED panel according to claim 8, wherein the first block wall and the second block wall are made of an organic material.

13. A flexible OLED panel, comprising:
a flexible substrate, the flexible substrate comprising:
a first organic layer;
an inorganic layer disposed on the first organic layer; and
a second organic layer disposed on the inorganic layer, the second organic layer comprising a channel;
a buffer layer disposed on the flexible substrate, a portion of the buffer layer disposed in the channel and contacting with the inorganic layer, the buffer layer comprising a buffer layer groove;
a first block wall disposed on the buffer layer, the first block wall surrounding the buffer layer groove and defining a display region; and
a packaging layer disposed in the display region, the packaging layer comprising an organic packaging layer, a portion of the organic packaging layer disposed in the buffer layer groove and contacting with the second organic layer of the flexible substrate.

14. The flexible OLED panel according to claim 13, wherein material of the second organic layer comprises polyimide.

15. The flexible OLED panel according to claim 13, wherein the flexible OLED panel further comprises a second block wall, the second block wall is disposed on the buffer layer and over the channel, and the second block wall surrounds the first block wall.

16. The flexible OLED panel according to claim 15, wherein the first block wall and the second block wall are made of an organic material.

17. The flexible OLED panel according to claim 13, further comprising a planarization layer and a pixel defining layer, the planarization layer and the pixel defining layer being disposed in the display region, wherein the planarization layer is disposed on the buffer layer, and the pixel defining layer is disposed on the planarization layer.

* * * * *